(12) United States Patent
Barna

(10) Patent No.: US 6,875,656 B2
(45) Date of Patent: Apr. 5, 2005

(54) METHOD FOR IMPROVING SILICON-ON-INSULATOR (SOI) FILM UNIFORMITY ON A SEMICONDUCTOR WAFER

(75) Inventor: Gabriel G. Barna, Dallas, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/444,150

(22) Filed: May 22, 2003

(65) Prior Publication Data

US 2004/0232489 A1 Nov. 25, 2004

(51) Int. Cl.[7] .............................................. H01L 21/336
(52) U.S. Cl. ........................ 438/269; 438/981; 257/347
(58) Field of Search ................................. 438/289, 519, 438/522, 766, 911, 920, 981; 257/336, 344, 347, 410, 411

(56) References Cited

U.S. PATENT DOCUMENTS 5,679,475 A * 10/1997 Yamagata et al. .......... 428/698
6,372,609 B1 * 4/2002 Aga et al. ................... 438/459
6,429,488 B2 * 8/2002 Leobandung et al. ....... 257/354
6,500,719 B1 * 12/2002 Hahn ......................... 438/300

* cited by examiner

Primary Examiner—Phuc T. Dang
(74) Attorney, Agent, or Firm—Wade James Brady, III; Frederick J. Telecky, Jr.

(57) ABSTRACT

A method for improving the thickness uniformity of a silicon-on-insulator (SOI) film on a semiconductor wafer. The preferred embodiments disclose using a selective epitaxial growth (SEG), sacrificial oxidation and an oxide removal process for improving SOI thickness uniformity. The SEG process is a leveling process that grows a materially identical layer of epitaxial silicon over the SOI layer, thus thickening the SOI layer and increasing its thickness uniformity. The sacrificial oxidation process oxidizes a portion of the newly thickened SOI layer, converting it into an oxide. An oxide removal process, commonly an etch process, removes the oxide produced by sacrificial oxidation while maintaining the thickness uniformity achieved by SEG leveling.

38 Claims, 2 Drawing Sheets

METHOD FOR IMPROVING SILICON-ON-INSULATOR (SOI) FILM UNIFORMITY ON A SEMICONDUCTOR WAFER

BACKGROUND

Semiconductor devices, commonly called integrated circuits, are fabricated on wafers, thin discs typically sliced from a single-crystal silicon ingot. Integrated circuits, comprised of numerous circuit elements, are typically constructed in layers on the wafer surface. The creation of circuit elements and their interconnections involves a complex series of fabrication steps including oxidation, photoresist coating, patterning, etching, ion implantation, resist stripping, and various cleaning, plating and deposition processes. Many of the fabrication processes are repeated numerous times, constructing layer after layer until fabrication is complete. Metal layers (which typically increase in number as device complexity increases) include patterns of conductive material that are isolated from one another vertically by alternating layers of isolating material. Vertical conductive tunnels called "vias" pass through isolating layers to form conductive pathways between vertically spaced conductive patterns.

Advancing technology requires that transistors switch signals faster, operate at lower power and demonstrate less vulnerability to background cosmic ray particles that could impede operation. Building faster integrated circuits requires smaller internal circuit elements, which tend to produce a lot of heat from the high power typically required. Adequate heat dissipation has proven to be an obstacle to advancing technology. Other electrical problems, must also be addressed, such as "latch-up," a failure mechanism of CMOS integrated circuits characterized by excessive current drain coupled with functional failure, parametric failure and/or device destruction.

To address these and other issues, the thin silicon-on-insulator (SOI) technique, an alternative concept for fabricating integrated circuits, was developed. Referring now to FIG. 1, instead of using conventional bulk silicon wafers 100 that are essentially a single layer of silicon 110, SOI wafer fabrication utilizes wafers 200, as shown in FIG. 2. SOI wafers 200 include three fundamental layers: a thin surface layer 210 on which transistors are formed, an underlying layer 220 of electrically insulating material, and a thicker supporting silicon wafer 230 underneath. The insulating layer 220, usually made of silicon dioxide and referred to as the "buried oxide" or "BOX," is usually a few thousand Angstroms thick. The SOI layer 210 is typically between a few hundred Angstroms to several microns thick.

The SOI technique offers the ability to produce transistors that operate at lower parasitic current than those designed on conventional bulk-silicon wafers. This lower parasitic current often results in less battery power drain and die heating. Further, a 20 to 50 percent increase in switching speed may be obtained over similar circuits built on conventional bulk silicon wafers. When transistors are fabricated on an SOI layer, they may switch signals faster, run with a lower current, and tend to be much less vulnerable to signal noise from cosmic ray particles than those built on bulk silicon wafers. Since each transistor on an SOI wafer may be isolated from adjacent transistors by a buried oxide and a shallow trench isolation (STI) region—a non-conductive area of deposited oxide—they are well isolated and virtually immune to latch-up. Consequently, they do not require as much separation from one another and may be spaced closer together than transistors fabricated on conventional bulk silicon wafers. Consequently, SOI technology contributes to more compact die designs, which increases the potential for performance improvements and a higher number of dies per wafer.

Historically, semiconductor fabrication has involved constructing the integrated circuits on the surface of a bulk silicon wafer. Referring now to FIG. 3, a typical structure of a transistor 140 on a bulk silicon wafer 100 is shown. In a conventional process, a layer of silicon dioxide ($SiO_2$) 148 is grown on the surface of the silicon wafer 100. A gate 150 (typically polysilicon) is formed over the silicon dioxide 148. A series of processes then etches a pattern into the silicon dioxide 148, exposing areas of the silicon substrate below. These exposed areas are then "doped," or implanted with impurities, to give the silicon desired electrical conducting properties. This doping process produces the source 142 and drain 144 regions, conductive impurity regions separated by a channel 146.

When a minimum threshold voltage ($V_t$) is applied to the gate 150, current will flow through the channel 146, turning the transistor 140 on. A well region 151 may be located underneath the channel 146, extending to the underlying silicon layer 110, and electrically isolating the source 142 and drain 144 from the underlying silicon. Transistors 140 may be electrically isolated from adjacent transistors by STI regions 156. With transistors fabricated on conventional bulk silicon wafers, the channel must fully charge the gate capacitance in order to close and has to discharge the capacitance in order to open again. Thus, transistors constructed on conventional bulk wafers are inherently slower in operation than those constructed on SOI wafers.

Referring now to FIG. 4, a typical construction of a transistor 240 on an SOI wafer 200 is shown. In the SOI process, a transistor 240 is formed on the SOI layer 210, using basically the same fabrication process that was described with FIG. 3. A layer of silicon dioxide ($SiO_2$) 248 is grown on the SOI layer 210. A typically polysilicon gate 250 is formed on top of this silicon dioxide layer 248. A series of processes then etches a pattern into the silicon dioxide 248, exposing areas of the SOI substrate 210 below. The remaining silicon dioxide 248 isolating the gate 250 from the SOI layer 210 is referred to as a "gate oxide." The exposed SOI areas are then "doped," to form the source 242 and drain 244, which are separated by a channel 246. Unlike conventional transistor construction on a bulk silicon wafer, in the SOI wafer 200, the source 242, drain 244 and channel 246 are isolated from the bulk silicon layer 230 by a buried oxide layer 220. The transistor 240 may include a well region (not shown) underneath the channel 246.

The greater electrical isolation afforded by the SOI configuration beneath each transistor may reduce the amount of electrical isolation required laterally. As previously mentioned, this additional isolation allows transistors to be spaced closer together. Consequently, when transistors are built within a thin SOI layer, they may be able to switch signals faster and operate at a lower power. Fabricating circuits on SOI wafers allows for more compact integrated circuit designs, allowing smaller IC devices and more dies per wafer, increasing fab productivity. Isolating the active transistor from the rest of the silicon substrate with the buried oxide layer reduces the electrical current leakage that otherwise degrades the performance of the transistor. Since the area of electrically active silicon is limited to the immediate region around the transistor, switching speeds are increased and sensitivity to "soft errors," a major concern for large-scale data storage and high-volume servers, is greatly reduced.

Fully depleted SOI (FD-SOI) technology is trending continually toward thinner SOI layers under the gate region. As gate lengths shrink, so too must the thickness ($T_{SOI}$) of the SOI film under the gate region. Referring again to FIG. 4, a thin gate oxide layer 248 isolates the gate 250 from the SOI layer 210. It has been established that a ratio ($L_g/T_{SOI}$) of gate length 252 to SOI thickness 254 of about 5 for planar FD-SOI devices—as measured under the gate region— provides transistors with optimum operational characteristics. With current FD-SOI device technology, as SOI thickness under the gate is typically less than 10 nanometers (nm), microscopic thickness variations of the SOI film under the gate may complicate the effort to maintain the desired SOI layer thickness.

Processing of fully depleted SOI (FD-SOI) devices generally requires that the thickness of the SOI layer below the gate be in the order of 5–10 nanometers (nm) for devices with gate lengths of 50 nm and below. As gate lengths shrink in the future, the SOI layer for FD-SOI devices may also be required to shrink in thickness, accordingly. Other technologies, such as partially depleted SOI wafers (PD-SOI) generally have much thicker SOI layers, so typically small variations in SOI film uniformity may or may not pose a problem on PD-SOI devices. However, it will be understood that the preferred embodiments will also address SOI film thickness uniformity on a variety of SOI technologies, if warranted.

It is very difficult to attain SOI thickness uniformity across a wafer when dealing with such small dimensions. However, variations in the SOI film thickness may directly translate to significantly increased dispersion—or wider variation—of electrical values across the wafer, including poorer electrical and thermal performance and decreased device yield. A method for improving the SOI film thickness on both the "macro" and "micro" levels of a wafer is desired. Macro-level thickness uniformity refers to achieving SOI film uniformity across the wafer, from die to die. Micro-level thickness uniformity refers to achieving SOI film uniformity on the smaller "gate level," or from transistor to transistor.

On such small dimensions, variations in SOI thickness may have adverse effects on subsequent fabrication operations, and consequently, on transistor operation. The operational characteristics of a transistor are very dependent on its geometry. Since more than one transistor may work in conjunction, as with a CMOS device, geometric inconsistencies between interconnected transistors may result in variable circuit performance—including heat buildup, voltage irregularities and other electrical problems. As mentioned previously, numerous electrical problems may arise from an SOI layer with a non-uniform under-gate thickness.

As technology advances and gate lengths continue to get smaller, the need to achieve SOI film uniformity will increase. As previously mentioned, since smaller gates will require thinner SOI layers, ever-smaller variations in the SOI thickness will become undesirable and more troublesome. Consequently, a new method is desired to improve thickness uniformity of the SOI layer under the gate region. These and related desires are addressed by the present invention.

BRIEF SUMMARY

The problems noted above are solved in large part by a method for reducing the thickness non-uniformity of a silicon-on-insulator (SOI) layer within a semiconductor wafer. In accordance with the preferred embodiments, the method includes leveling the SOI layer by a selective epitaxial growth (SEG) process. Sacrificial oxidation is then performed, converting a portion of the thickened SOI layer to a sacrificial oxide. Finally, oxide removal is performed, to removing the sacrificial oxide from the wafer.

BRIEF DESCRIPTION OF THE DRAWINGS

For a detailed description of the embodiments of the invention, reference will now be made to the accompanying drawings in which.

NOTATION AND NOMENCLATURE

Certain terms are used throughout the following description and claims to refer to particular system components. As one skilled in the art will appreciate, different companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . "

The term "integrated circuit" refers to a set of electronic components and their interconnections (internal electrical circuit elements, collectively) that are patterned on the surface of a microchip. The term "semiconductor device" refers generically to an integrated circuit (IC), which may be integral to a semiconductor wafer, singulated from a wafer, or packaged for use on a circuit board. The term "die" ("dies" for plural) refers generically to an integrated circuit, in various stages of completion, including the underlying semiconductor substrate and all circuitry patterned thereon. The term "wafer" refers to a generally round, single-crystal semiconductor substrate upon which integrated circuits are fabricated in the form of dies. The term "interconnect" refers to a physical connection providing possible electrical communication between the connected items. The term "layer" refers to a thin stratum within a semiconductor wafer. The term "film" refers to a relatively thin layer within a semiconductor wafer.

To the extent that any term is not specially defined in this specification, the intent is that the term is to be given its plain and ordinary meaning.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims, unless otherwise specified. In addition, one skilled in the art will understand that the following description has broad application, and the discussion of any embodiment is meant only to be exemplary of that embodiment, and not intended to intimate that the scope of the disclosure, including the claims, is limited to that embodiment.

Discussed herein are a method and related system for using selective epitaxial growth (SEG), sacrificial oxidation and oxide removal processes in combination on silicon-on-insulator (SOI) wafers to improve SOI layer thickness and surface uniformity. An SOI wafer is typically a wafer in which transistors are fabricated on a thin silicon film that is isolated from a thicker silicon base by a buried oxide layer. Several methods of creating an SOI wafer are well known in the art.

Figure 1:
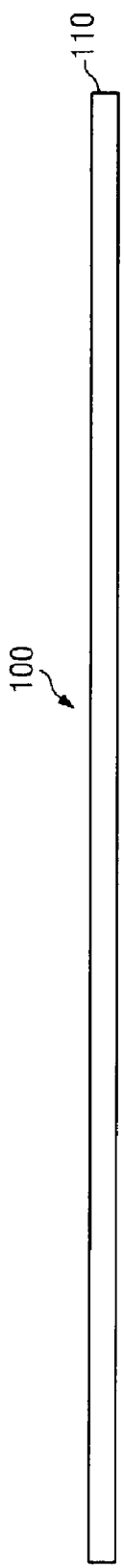
FIG. 1 shows a cross-sectional view of a conventional bulk silicon wafer.
Figure 2:
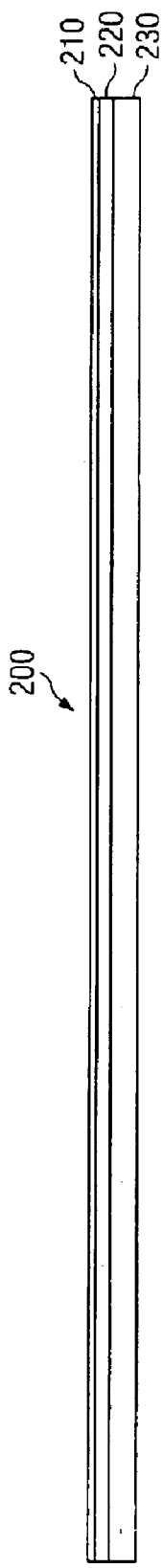
FIG. 2 shows a cross-sectional view of a silicon-on-insulator (SOI) wafer.
Figure 4:
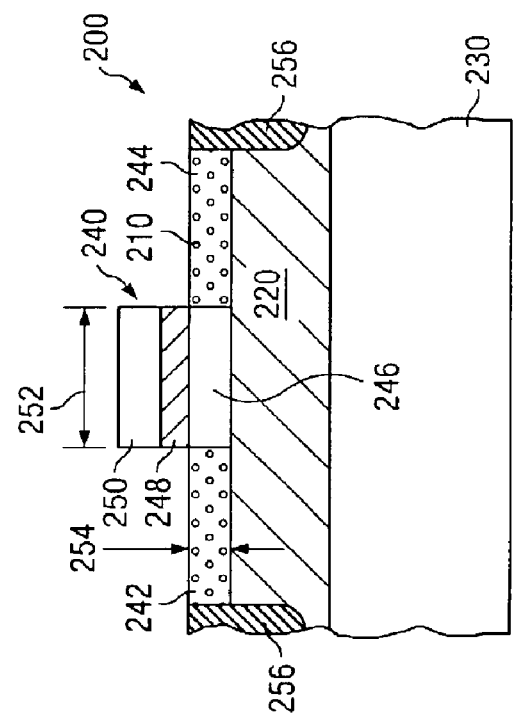
FIG. 4 shows a cross-sectional view of a typical transistor formed on an SOI wafer.
Figure 3:
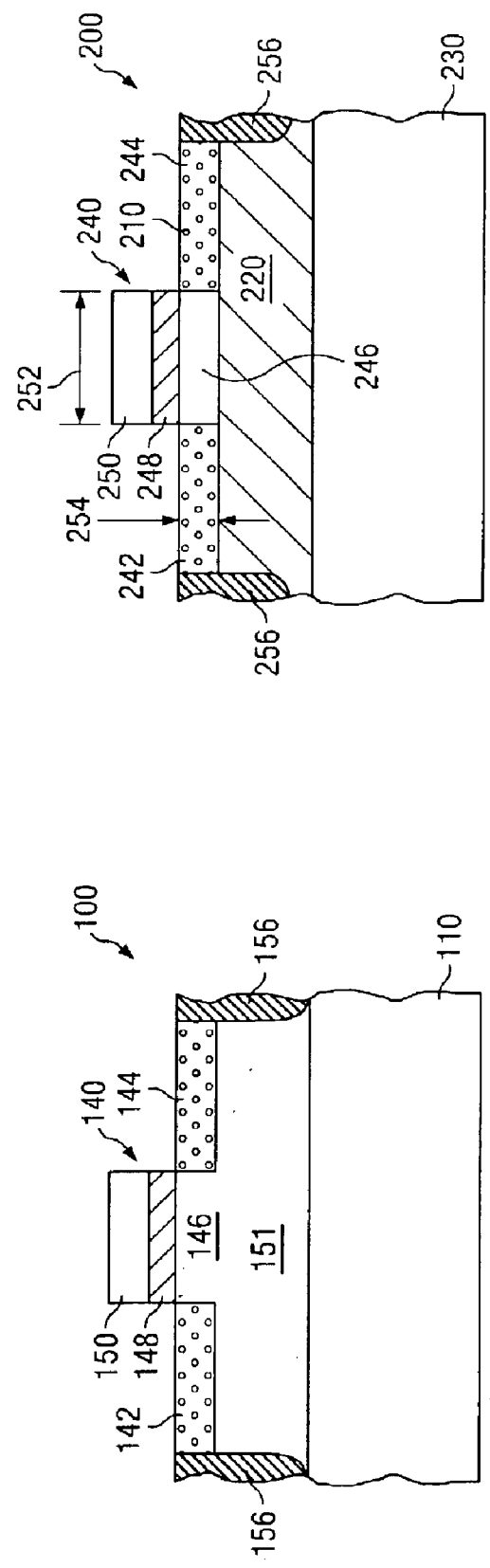
FIG. 3 shows a cross-sectional view of a typical transistor formed on a conventional bulk silicon wafer.

Referring again to FIG. 4, a typical construction of a transistor 240 on an SOI wafer 200 is shown. In the SOI transistor fabrication process, a transistor 240 may be formed on the SOI layer 210, the uppermost layer of silicon on the SOI wafer 200. When the completed transistor 240 is turned on, a current flows between the source 242 and drain 244, through channel 246. A layer of gate oxide 248 is formed over the channel 246, isolating the channel from the gate 250. The transistor 240 is electrically isolated from adjacent transistors by shallow trench isolation (STI) regions 256, which are non-conductive areas of deposited oxide. Unlike conventional bulk silicon wafers, a buried oxide layer 220 isolates the transistor components from the underlying silicon base 230, a configuration that has many electrical benefits.

The distance between source 242 and drain 244 is referred to as the "gate length" ($L_g$) 252. The thickness of the silicon-on-insulator (SOI) film is referred to as the "SOI thickness" ($T_{SOI}$) 254. A gate-length-to-SOI-thickness ($L_g/T_{SOI}$) ratio of about five provides a transistor with the most optimum operational characteristics. A more uniform SOI thickness allows $L_g/T_{SOI}$ ratio variations across the length of the gate to be minimized while affording control of a more uniform SOI layer thickness.

Figure 5A:
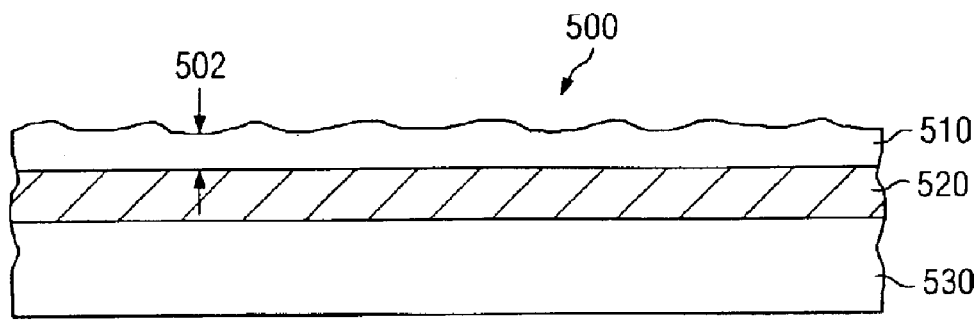
FIG. 5a shows a cross-sectional view of an SOI wafer with a non-uniform SOI layer thickness.

FIG. 5a shows a cross-section of an SOI wafer 500 having an SOI layer 510 of non-uniform thickness 502, a buried oxide layer 520 and a silicon base 530. When first manufactured, the SOI layer 510 may demonstrate microscopic variations in thickness 502, which may produce fluctuations in the $L_g/T_{SOI}$ ratio, impacting transistor performance. In the future, as technology advancements produce gate lengths that are reduced in size, small variations in SOI film thickness may become even more problematic on FD-SOI and other technologies, as the thickness variations will be an even greater percentage of the total SOI layer thickness. The method of the preferred embodiments will improve SOI thickness uniformity and allow greater control over the SOI thickness.

Achieving consistent fabrication of transistors across a wafer requires stringent within-wafer (WIW) SOI thickness uniformity on both the macro and micro levels. Macro-level thickness uniformity refers to achieving SOI film uniformity across the wafer, from die to die. Micro-level thickness uniformity refers to achieving SOI film uniformity on the smaller "gate level," or from transistor to transistor. SOI layer thickness in one area of a wafer should be identical to that in another region of the wafer.

Figure 5B:
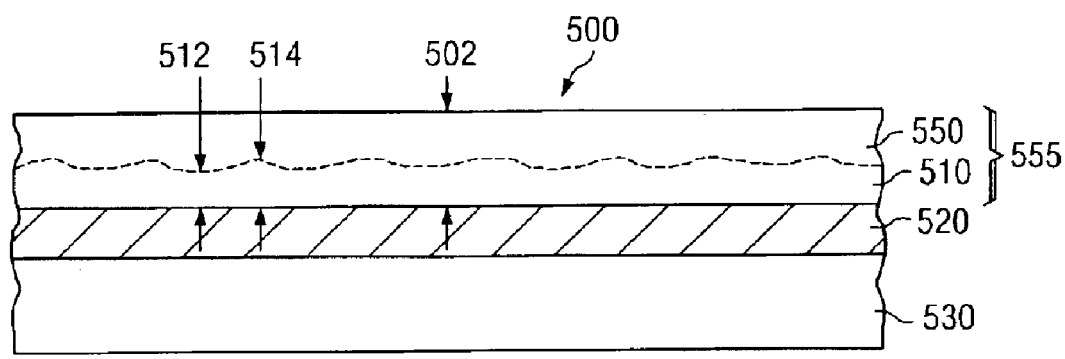
FIG. 5b shows a cross-sectional view of an SOI wafer after selective epitaxial growth (SEG) leveling.

In a preferred embodiment of the present invention, as shown in FIG. 5b, an SOI wafer 500 is subjected to a selective epitaxial growth (SEG) process. In the SEG process, an epitaxial layer (i.e. EPI) 550 of silicon is grown on the SOI layer 510 typically by depositing silicon atoms on the SOI layer in a chemical vapor deposition (CVD) process, although other methods may be used. The CVD process for epitaxial growth is preferably a high-temperature process utilizing dichlorosilane (DCS or $SiH_2Cl_2$) and hydrochloric acid (HCl), although other gases such as disilane ($Si_2H_6$), may be used. Preferably, the CVD epitaxial growth process occurs between about 600C and about 900C. More preferably, the CVD epitaxial growth process occurs between about 650C and about 850C. Most preferably, the CVD epitaxial growth process occurs at about 700C.

The epitaxial layer 550 is a layer of silicon having substantially the same material properties and crystal orientation as the SOI layer 510 below. In effect, the SEG process creates a combined SOI/EPI layer 555 of homogeneous material with a greater thickness 502 and no discernable delineation between the SOI and EPI materials. It will be understood that, while referred to as a combination of two layers, the combined SOI/EPI layer 555 is merely a thicker silicon-on-insulator (SOI) layer created by the epitaxial growth process.

The SEG process can be viewed is a leveling process, as it has been shown to have the effect of reducing thickness non-uniformities within an SOI layer 510. That is, areas of smaller thickness 512 on the original SOI layer 510 generally experience a faster rate of EPI layer growth, and areas of greater thickness 514 generally experience a slower rate of EPI layer growth. The SEG crystal growth process has the desired side effect of increasing growth rate on initially thinner areas, such that the SOI layer 510 is leveled as the growth process progresses. Consequently, the selective epitaxial growth process has the effect of leveling the SOI layer 510 by increased growth of EPI 550 in the areas which need it the most.

As SOI layers decrease in thickness to about 10 nm and below, the need for the leveling effect typically increases, since the thickness non-uniformity becomes a greater percent of the absolute SOI layer thickness 502. As more EPI 550 is deposited (e.g. in the 20–40 nm range), as a result of the epitaxial growth process, the overall thickness of the combined SOI/EPI layer 555 becomes more uniform. Small thickness variations are reduced, and the thickness across the entire wafer becomes more uniform, with a smaller variation on both wafer-scale (i.e. from die to die) and micro-scale (i.e. within a die) measurements.

A highly uniform SOI/EPI layer 555 can be generated across the wafer where the SOI 510 already exists, as the selective EPI deposition process largely prevents silicon deposition on oxides or other non-silicon areas. Consequently, after selective epitaxial growth, the SOI/EPI layer 555 has a greater, but more uniform, thickness than the original SOI layer 510. However, as previously mentioned, the thickness of the SOI film is critical to proper transistor operation. As such, the newly grown SOI/EPI layer 555 is generally too thick to be used under the gate. Therefore, this leveled SOI/EPI layer 555 must be thinned in order to reach a preferred SOI thickness.

In order to reduce the SOI/EPI layer 555 down to an acceptable thickness, sacrificial oxidation and oxide removal processes are employed. Sacrificial oxidation is a process, much like the rusting of a metal, in which an oxide is grown into the silicon surface by exposure to oxygen in a controlled environment. The process is sacrificial because a portion of the silicon is "sacrificed," or converted into silicon dioxide ($SiO_2$) by the oxidation process. Typically, sacrificial oxidation is performed by exposing the silicon to an elevated-temperature environment in the presence of an oxidant. Preferably, sacrificial oxidation is accomplished by the formation of a thermal oxide in a furnace with an oxygen source present. The surface of the silicon is oxidized to SiO2 at a temperature between about 800C and about 1000C, with the SiO2 consuming some of the silicon at a well-known rate. More preferably, the sacrificial oxidation process occurs between about 850C and about 950C. Most preferably, the sacrificial oxidation process occurs at about 900C. It will be understood that several variations in the method used for sacrificial oxidation may be used without departing from the spirit of the invention.

Figure 5C:
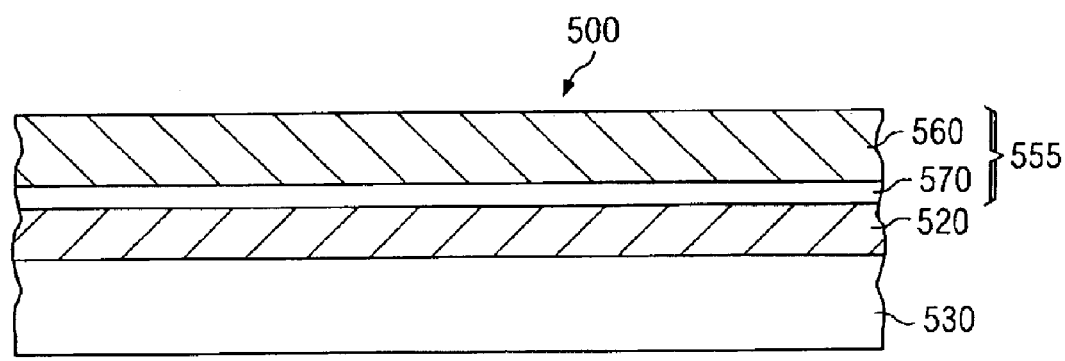
FIG. 5c shows a cross-sectional view of an SOI wafer after sacrificial oxidation.

FIG. 5c shows a cross-section of the wafer 500 after a sacrificial oxidation process. The preferred oxidation process is called "sacrificial" in that a portion of the SOI/EPI material is sacrificed during the oxidation process as the silicon material is converted to $SiO_2$, thereby thinning the remaining SOI/EPI layer in the process. Wafer 500 exhibits an thickness of oxidation 560 that has formed into the SOI/EPI layer 555, converting a percentage of the SOI/EPI thickness into silicon dioxide. After sacrificial oxidation, a relatively thin SOI layer 570 having a substantially uniform thickness is left underneath the layer of oxide 560. It will be understood that the sacrificial oxide process does not increase SOI thickness non-uniformity. Oxidation of the silicon substantially maintains the uniformity achieved through the SEG leveling process.

After the newly leveled SOI/EPI layer 555 is thinned to the proper thickness by sacrificial oxidation, the thinner SOI layer 570 underneath has to be exposed. Preferably, oxide removal is performed using a wet etch process, which has been shown to maintain SOI thickness uniformity achieved previously during SEG leveling. In a wet etch process, the wafer may be dipped into a batch of hydrofluoric acid (HF) or other wet-clean etchant. Preferably, the HF is diluted with deionized (DI) water forming an aqueous solution comprising between about 45 percent by weight and about 55 percent by weight of HF. More preferably, the aqueous solution comprises between about 48.5 percent by weight and about 50.5 percent by weight of HF. Most preferably, the aqueous solution comprises about 49 percent by weight of HF. To etch $SiO_2$, the aqueous solution of HF is typically mixed with DI water or ammonium fluoride and DI water to further reduce and/or buffer the etch rate. It will be understood that other methods of oxide removal known in the art, such as plasma etch, may also produce suitable SOI thickness uniformity results after removal of sacrificial oxidation.

Figure 5D:
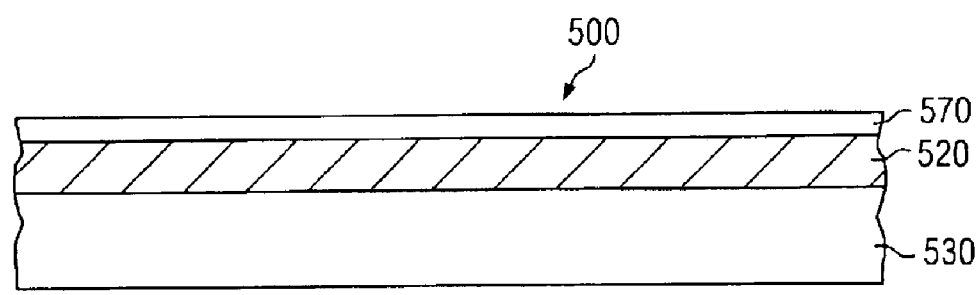
FIG. 5d shows a cross-sectional view of an SOI wafer after oxide removal.

FIG. 5d shows the SOI wafer 500 after sacrificial oxide removal, with the leveled and thinned SOI layer 570 exposed. Once thinned to the desired thickness, the SOI layer 570 is ready for subsequent transistor fabrication steps. It will be understood that, the method of the preferred embodiments may be applied at the beginning of transistor fabrication, but it may also be applied after some transistor fabrication steps have taken place (e.g. just before gate stack deposition). The uniform SOI thickness may contribute to improved and more consistent transistor operation. Therefore, when used in combination in accordance with the preferred embodiments, selective epitaxial growth (SEG), sacrificial oxidation, and oxide removal processes have been shown to improve thickness uniformity of silicon-on-insulator (SOI) films and transistor operation.

Numerous variations and modifications will become apparent to those skilled in the art once the above disclosure is fully appreciated.

What is claimed is:

1. A method for reducing thickness non-uniformity of a silicon-on-insulator (SOI) layer within a semiconductor wafer, comprising the steps of:
   (a) providing a device having a relatively non-uniform SOI layer;
   (b) substantially conformally depositing silicon on the relatively non-uniform SOI layer by a selective epitaxial growth (SEG) process, to provide an SOI layer of substantially uniform thickness;
   (c) performing sacrificial oxidation to a predetermined substantially uniform depth of said SOI layer of substantially uniform thickness to convert a portion of the SOI layer of substantially uniform thickness to a sacrificial oxide; and
   (d) removing the sacrificial oxide.

2. The method of claim 1, wherein the SEG process is a chemical vapor deposition (CVD) process.

3. The method of claim 2, wherein the CVD process utilizes dichlorosilane and hydrochloric acid.

4. The method of claim 2, wherein the CVD process utilizes disilane.

5. The method of claim 2, wherein the CVD process occurs between about 700C and about 900C.

6. The method of claim 5, wherein the CVD process occurs between about 750C and about 850C.

7. The method of claim 6, wherein the CVD process occurs at about 800C.

8. The method of claim 1, wherein sacrificial oxidation is performed by exposing the SOI layer to an elevated-temperature environment in the presence of an oxidant.

9. The method of claim 8, wherein sacrificial oxidation occurs in the presence of oxygen.

10. The method of claim 9, wherein sacrificial oxidation occurs between about 800C and about 1000C.

11. The method of claim 10, wherein sacrificial oxidation occurs between about 850C and about 950C.

12. The method of claim 11, wherein sacrificial oxidation occurs at about 900C.

13. The method of claim 1, wherein the oxide is removed by an etching process.

14. The method of claim 13, wherein the etching process is a wet etch process.

15. The method of claim 14, wherein the wet etch process utilizes an aqueous solution comprising hydrofluoric acid (HF).

16. The method of claim 15, wherein the aqueous solution comprises between about 45 percent by weight and about 55 percent by weight of HF.

17. The method of claim 16, wherein the aqueous solution comprises between about 48.5 percent by weight and about 50.5 percent by weight of HF.

18. The method of claim 17, wherein the aqueous solution comprises about 49 percent by weight of HF.

19. The method of claim 13, wherein the etching process is a plasma etch process.

20. A semiconductor wafer including an SOI layer and prepared according to a method comprising the steps of:
   (a) providing a device having a relatively non-uniform SOI layer:
   (b) substantially conformally depositing silicon on the relatively non-uniform SOI layer by a selective epitaxial growth (SEG) process, to provide an SOI layer of substantially uniform thickness;
   (c) performing sacrificial oxidation to a predetermined substantially uniform depth of said SOI layer of substantially uniform thickness to convert a portion of the SOI layer of substantially uniform thicknes to a sacrificial oxide; and (d) removing the sacrificial oxide.

21. The wafer of claim 20, wherein the SEG process is a chemical vapor deposition (CVD) process.

22. The wafer of claim 21, wherein the CVD process utilizes dichlorosilane and hydrochloric acid.

23. The wafer of claim 21, wherein the CVD process utilizes disilane.

24. The wafer of claim 21, wherein the CVD process occurs between about 700C and about 900C.

25. The wafer of claim 24, wherein the CVD process occurs between about 750C and about 850C.

26. The wafer of claim 25, wherein the CVD process occurs at about 800C.

27. The wafer of claim 20, wherein sacrificial oxidation is performed by exposing the SOI layer to an elevated-temperature environment in the presence of an oxidant.

28. The wafer of claim 27, wherein sacrificial oxidation occurs in the presence of oxygen.

29. The wafer of claim 28, wherein sacrificial oxidation occurs between about 800C and about 1000C.

30. The wafer of claim 29, wherein sacrificial oxidation occurs between about 850C and about 950C.

31. The wafer of claim 30, wherein sacrificial oxidation occurs at about 900C.

32. The wafer of claim 20, wherein the oxide is removed by an etching process.

33. The wafer of claim 32, wherein the etching process is a wet etch process.

34. The wafer of claim 33, wherein the wet etch process utilizes an aqueous solution comprising hydrofluoric acid (HF).

35. The wafer of claim 34, wherein the aqueous solution comprises between about 45 percent by weight and about 55 percent by weight of HF.

36. The wafer of claim 35, wherein the aqueous solution comprises between about 48.5 percent by weight and about 50.5 percent by weight of HF.

37. The wafer of claim 36, wherein the aqueous solution comprises about 49 percent by weight of HF.

38. The wafer of claim 32, wherein the etching process is a plasma etch process.

\* \* \* \* \*